United States Patent [19]

Chang

[11] Patent Number: 5,144,519
[45] Date of Patent: Sep. 1, 1992

[54] ELECTROSTATIC PROTECTION CIRCUIT FOR SEMICONDUCTOR CHIP

[75] Inventor: Deugsoo Chang, Seoul, Rep. of Korea

[73] Assignee: Samsung Electronics Co., Ltd., Suwon, Rep. of Korea

[21] Appl. No.: 706,803

[22] Filed: May 29, 1991

[30] Foreign Application Priority Data

Oct. 29, 1990 [KR] Rep. of Korea ............... 90-17381

[51] Int. Cl.$^5$ .............................................. H02H 9/00
[52] U.S. Cl. ...................................... 361/58; 361/100
[58] Field of Search ................. 361/58, 56, 90, 78, 361/84, 86, 100

[56] References Cited

U.S. PATENT DOCUMENTS

| | | | |
|---|---|---|---|
| 3,947,727 | 3/1976 | Stewart | 317/31 |
| 4,043,112 | 8/1977 | Tanaka | 58/23 BA |
| 4,437,135 | 3/1984 | Ogata et al. | 361/91 |
| 4,728,932 | 3/1988 | Atherton | 340/365 C |
| 4,930,037 | 5/1990 | Woo | 361/58 |

OTHER PUBLICATIONS

Microelectronics, Second Edition, Jacob Millman, Ph.D.; Arvin Grabel, Sc.D., pp. 238-240.

Primary Examiner—William H. Beha, Jr.
Assistant Examiner—Matthew Nguyen
Attorney, Agent, or Firm—Christie, Parker & Hale

[57] ABSTRACT

A semiconductor chip protection circuit has a transmission gate $TG_{11}$ disposed between an input pin 11 and an input terminal of an internal circuit 12, and two further transmission gates $TG_{12}$, $TG_{13}$ respectively connected between the input terminal of the internal circuit and a power terminal $V_{DD}$, and between the input terminal and a ground terminal. Two additional transmission gates $TG_{14}$, $TG_{15}$ are connected respectively between an output terminal of the internal circuit and the power terminal, and between the output terminal and ground. At least one final transmission gate $TG_{16}$ is connected between the power terminal and ground. Electrostatic charges are smoothly discharged because of the low resistance value of the N-type and P-type transistors of gates $TG_{11}$ to $TG_{16}$.

8 Claims, 4 Drawing Sheets

ELECTROSTATIC PROTECTION CIRCUIT FOR SEMICONDUCTOR CHIP

BACKGROUND OF THE INVENTION (1) Field of the Invention

The present invention relates to a protection circuit for protecting a semiconductor chip from damage due to electrostatic charges.

(2) Description of the Prior Art

Electrostatic charge generated by friction between materials having different dielectric constants can cause fetal damage to a semiconductor device by causing oxide breakdown or internal discharge in the thin oxide layer of the semiconductor. Therefore, when designing a semiconductor chip, a protection circuit is provided so that the internal circuit of the semiconductor chip will not be damaged by electrostatic charges. Particularly, to keep pace with the increasing circuit density and performance of semiconductor chips as a result of advancements in manufacturing techniques, it is necessary to provide a circuit to protect the chip from the electrostatic charges. Recently, such a protection circuit has become an important factor in the reliability of the chip.

This protection circuit has discharge paths formed between an input pin and an output pin, and between a power terminal and a ground terminal such that electrostatic charges will be discharged through these paths. Thus, the electrostatic charges will not be lead to the internal circuit.

The internal circuit includes various devices, such as resistors, diodes, punch-through transistors, field effect transistors, and parasitic capacitors. Among these devices, the diode and the transistor provide a discharge path for electrostatic charges, while a resistor is connected between the input pin and the input terminal of the internal circuit to determine the level of the input current. Further, between the output terminal of the internal circuit and the output pin, there can be disposed a resistor, depending on the capability of the output drive, but in most chips, this is not used.

An example of such a protection circuit is illustrated in FIG. 5. This circuit has a diode $D_1$ connected between an input pin 1 and a power terminal $V_{DD}$. The output pin 1 is connected through a resistance $R_1$ to an input terminal A of an internal circuit 2. Diodes $D_2$, $D_3$ are respectively connected between the input terminal A and the power terminal $V_{DD}$, and between the input terminal A and ground G. An output terminal B of the internal circuit 2 is connected to an output pin 3. Diodes $D_4$, $D_5$ are connected respectively between the output terminal and power terminal $V_{DD}$, and between the output terminal and ground G. A diode $D_6$ is connected between the power terminal $V_{DD}$ and the ground G.

In such a protection circuit, on the one hand, if positive electrostatic charges are supplied between the input pin 1 and power terminal $V_{DD}$, the positive electrostatic charges are discharged through the diodes $D_1$, $D_2$, and therefore, the electrostatic charges are not applied to the internal circuit 2. Here, resistor $R_1$ is in the form of a polysilicon- and a diffusion-type resistance, thereby setting the level of current flowing to the diode $D_2$.

On the other hand, if negative electrostatic charges are supplied between the input pin 1 and power terminal $V_{DD}$, a discharging path is formed in the reverse direction of the diodes $D_1$, $D_2$. Under this condition, the current level is decided at the reverse direction breakdown region of the diodes, and therefore, the diodes $D_1$, $D_2$ can be damaged by even a low level of electrostatic charges to such a degree that the characteristics of the diodes are degraded, thereby reducing the reliability of the protection circuit.

In the case where electrostatic charges are supplied between the input pin 1 and ground terminal G, if the electrostatic charges are negative, the diode $D_3$ discharges the electrostatic charges in the forward bias state. By contrast, if the electrostatic charges are negative, the diode $D_3$ is damaged in the manner described above.

Further, in the case where electrostatic charges are supplied between the power terminal $V_{DD}$ and ground terminal G, if the charges are positive, the diode $D_6$ smoothly discharges them in the forward bias state, while, if negative, the diode $D_6$ forms a discharge path in the reverse direction, and so the diode $D_6$ is likely to be damaged.

Where electrostatic charges are supplied between the output pin 3 and power terminal $V_{DD}$, and between the output pin 3 and ground terminal G, the diodes $D_4$, $D_5$ form discharge paths in a selective manner. However, under this condition, there are cases where the diodes $D_4$, $D_5$ form discharge paths in the reverse direction, thereby damaging the diodes.

FIG. 6 illustrates another protection circuit using transistors $M_1$, $M_2$, $M_3$, $M_4$, instead of the diodes $D_2$, $D_3$, $D_4$, $D_5$ of FIG. 5. In this circuit, the channel regions of the transistors $M_1$ to $M_4$ are utilized, in addition to using the characteristics of the usual diodes, and therefore, the discharging efficiency is somewhat higher than that of the protection circuit of FIG. 5.

That is, where punch-through transistors are used, and the generated electrostatic voltage is higher than the punch-through voltage of these transistors, the current levels of the diode $D_1$, the parasitic diodes of the transistors $M_1$, $M_2$, and the punch-through region can be utilized. Further, these discharge paths are parallel, and therefore, the capability of withstanding the voltage due toe electrostatic charges is increased.

However, where electrostatic charges are supplied between the power terminal $V_{DD}$ and the ground terminal G, if the charges are positive, the diode $D_6$ takes a forward bias state to smoothly discharge them, as in the case of FIG. 5. By contrast, if the charges are negative, the diode $D_6$ is operated in the reverse region, and therefore, the diode $D_6$ can be damaged, even under a low level of electrostatic voltage.

Further, where electrostatic charges are supplied between the input pin and another one of the input pins, between the output pin and another one of the output pins, or between the input and the output pins, the diode is operated in the reverse direction, and therefore, the chip can be damaged, even under a low level of electrostatic voltage.

Most tests for electrostatic charges use charge from the body of a worker. However, the above-described charges are low-level charges which can cause damage to chips, and therefore, enhanced protection of such a chip against damage is urgently required.

SUMMARY OF THE INVENTION

It is the object of the present invention to provide a chip protection circuit capable of protecting semiconductor chips from even a high level of electrostatic charges between pins.

According to the present invention, there is provided a semiconductor chip protection circuit comprising:

- a first transmission gate for connection between an input terminal of an internal circuit and an input pin;
- a second transmission gate for connection between the input terminal of the internal circuit and a power terminal;
- a third transmission gate for connection between the input terminal and a ground terminal;
- a fourth transmission gate for connection between an output terminal of the internal circuit and the power terminal;
- a fifth transmission gate for connection between the output terminal of the internal circuit and the ground terminal; and
- at least one sixth transmission gate for connection between the power terminal and the ground.

A general characteristic of the transmission gate is that its resistance component is very small as compared with a transistor. Further, during the opening of the gate, it has a lower resistance component than that of the transistor, even under a biased state, and bi-directional parasitic diodes can be obtained.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

Figure 1:
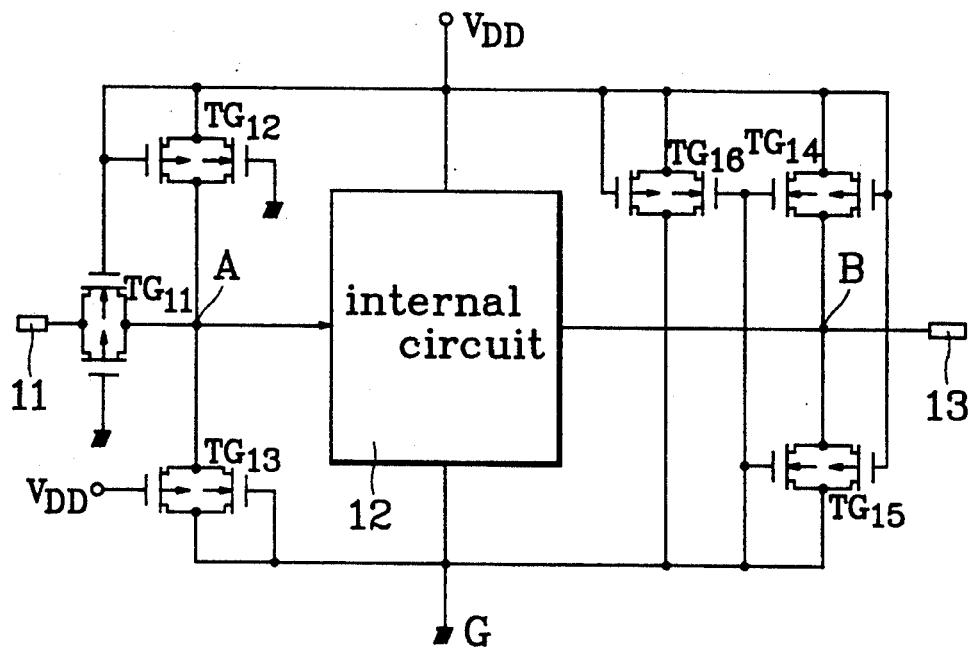
FIG. 1 is a circuit diagram of a first embodiment of a protection circuit according to the present invention.

FIG. 1 is a circuit diagram of the first embodiment of the protection circuit according to the present invention. As shown in this drawing, an input pin 11 is connected through a first transmission gate $TG_{11}$ to the input terminal A of an internal circuit 12. A second transmission gate $TG_{12}$ is connected between a power terminal $V_{DD}$ and the input terminal A. A third transmission gate $TG_{13}$ is connected between the input terminal A and a ground terminal G.

Further, the output terminal B of the internal circuit 12 is connected to an output pin 13. Fourth and fifth transmission gates $TG_{14}$, $TG_{15}$ are respectively connected between the output terminal B and power terminal $V_{DD}$, and between the output terminal B and ground terminal G. A sixth transmission gate $TG_{16}$ is connected between power terminal $V_{DD}$ and ground terminal G and, if necessary, a number of the sixth transmission $TG_{16}$ can be increased.

In the protection circuit, if gates $TG_{11}$ to $TG_{16}$ are opened, discharge paths for electrostatic charges are formed through the gates $TG_{11}$ to $TG_{16}$, and therefore, the internal circuit 12 is not damaged, even under a high level of electrostatic charges between all pins. Generally, the transmission gates used in the protection circuit in FIG. 1 consist of a parallel-connected circuit of a P-type transistor $Q_1$ and a N-type transistor $Q_2$, respectively as shown in FIG. 2A, and its equivalent circuit diagram is shown in FIG. 2B.

Figure 2A:
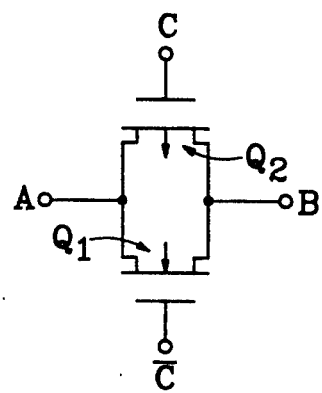
FIGS. 2A, 2B and 2C are a circuit diagram, an equivalent circuit diagram, and a graph of the resistance characteristics of a transmission gate used in the protection circuit of the present invention, respectively.

In FIG. 2A, if a control gate voltage $C=1$, the gate transits an input A to an output B so that $B=A$, whereas if $C=0$, no transmission is possible.

Figure 2B:
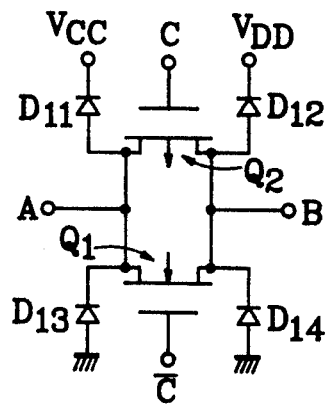

In FIG. 2B, the gate forms three discharge paths in the form of the P-type transistor $Q_1$, the N-type transistor $Q_2$ and bi-directional parasitic diodes $D_{11}$ to $D_{14}$.

Therefore, even a high level of electrostatic charges can be discharged smoothly, thereby preventing the damage to circuit 12.

Further, the first gate $TG_{11}$ is connected between the input pin 11 and the input terminal A of the circuit 12 to serve as a filter for noise signals intruding through the input pin 11 in the normal mode. Further, as shown in FIG. 2, the first gate $TG_{11}$ has resistance values in accordance with the P-type and N-type transistors, and therefore, when electrostatic charges are applied, the gate protects the internal circuit with a high resistance value.

Figure 3A:
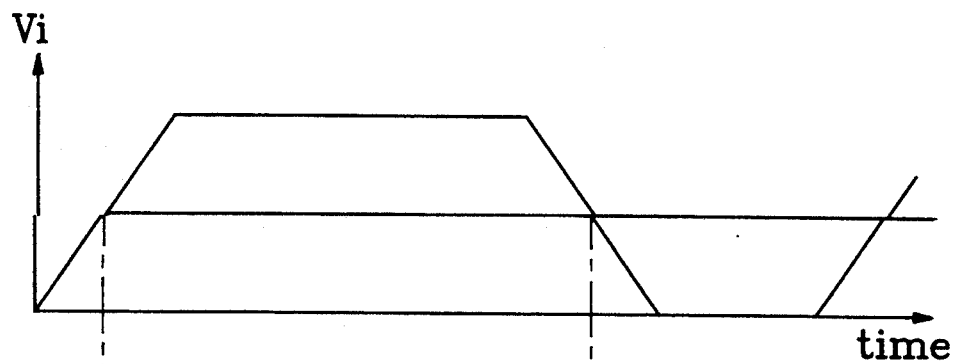
FIGS. 3A and 3B illustrate wave patterns of the signals at an input pin and an input terminal in FIG. 1, respectively.
Figure 3B:
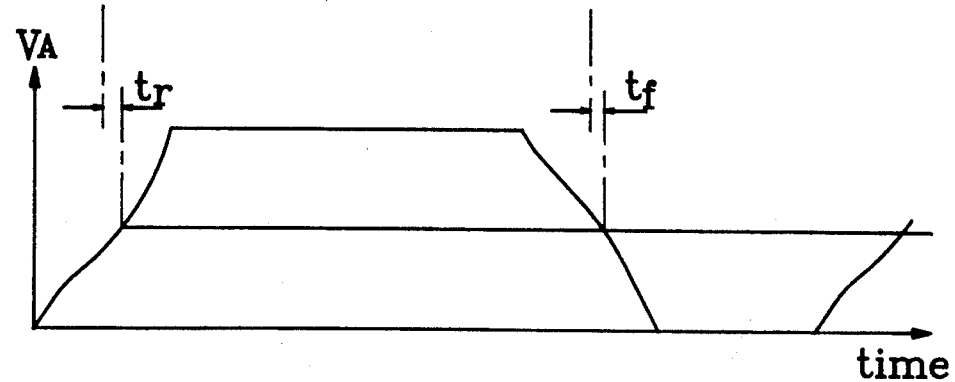

If signals of a high frequency are inputted to pin 11, the first gate $TG_{11}$ reduces the saturation peak current, and therefore, the gate operates in the manner illustrated in FIGS. 3A and 3B, thereby improving the AC characteristics. Thus, a high resistance value is obtained compared with the case where a conventional resistor is used. That is, where a signal Vi is inputted to pin 11, as is shown in FIG. 3A, the signal Vi appears at the input terminal A, as is shown in FIG. 3B, after passing through the first gate $TG_{11}$.

In FIG. 3B, $t_r$ indicates the time difference between the rising time of the input signal and the rising time of the output signal, and $t_f$ indicates the time difference between the falling time of the input signal and the falling time of the output signal. The values of $t_r$ and $t_f$ depend on the size of the first gate $TG_{11}$.

Figure 2C:
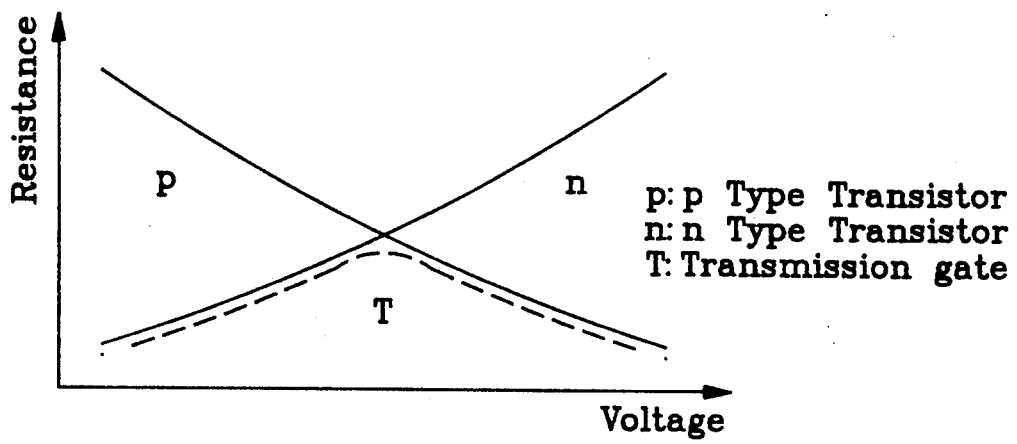

As to the characteristics of the transmission gates, as shown in FIG. 2, the resistance values will vary, depending substantially on the characteristics of the P-type and N-type transistors and the sizes of the devices during the turning-on of the channels. However, the net resistance obtained during the use of the transmission gate is shown by the dotted curve of FIG. 2, and it is seen that this dotted curve varies in accordance with the level of the input signal Vi. That is, the dotted curve represents the dynamic resistance characteristics and approximately corresponds with the middle level of the input signal Vi, i.e., with the logic threshold level, to reduce the dynamic peak current. Accordingly, the chip is protected even from a high level of electrostatic voltage.

Assuming that there is no the fourth transmission gate $TG_{14}$ of FIG. 1, if electrostatic charges are applied through output pin 13 toward power terminal $V_{DD}$, then the initial state is not turned off, because both the N-type transistor of the fifth gate $TG_{15}$ and the sixth gate $TG_{16}$ lie in the negative threshold region.

Therefore, the electrostatic charges are discharged through gates $TG_{15}$ and $TG_{16}$, and at the same time, the ground level is stepped up so that the N-type transistors of these gates are turned on, with the result that the electrostatic charges are discharged from the output pin 13.

Figure 4:
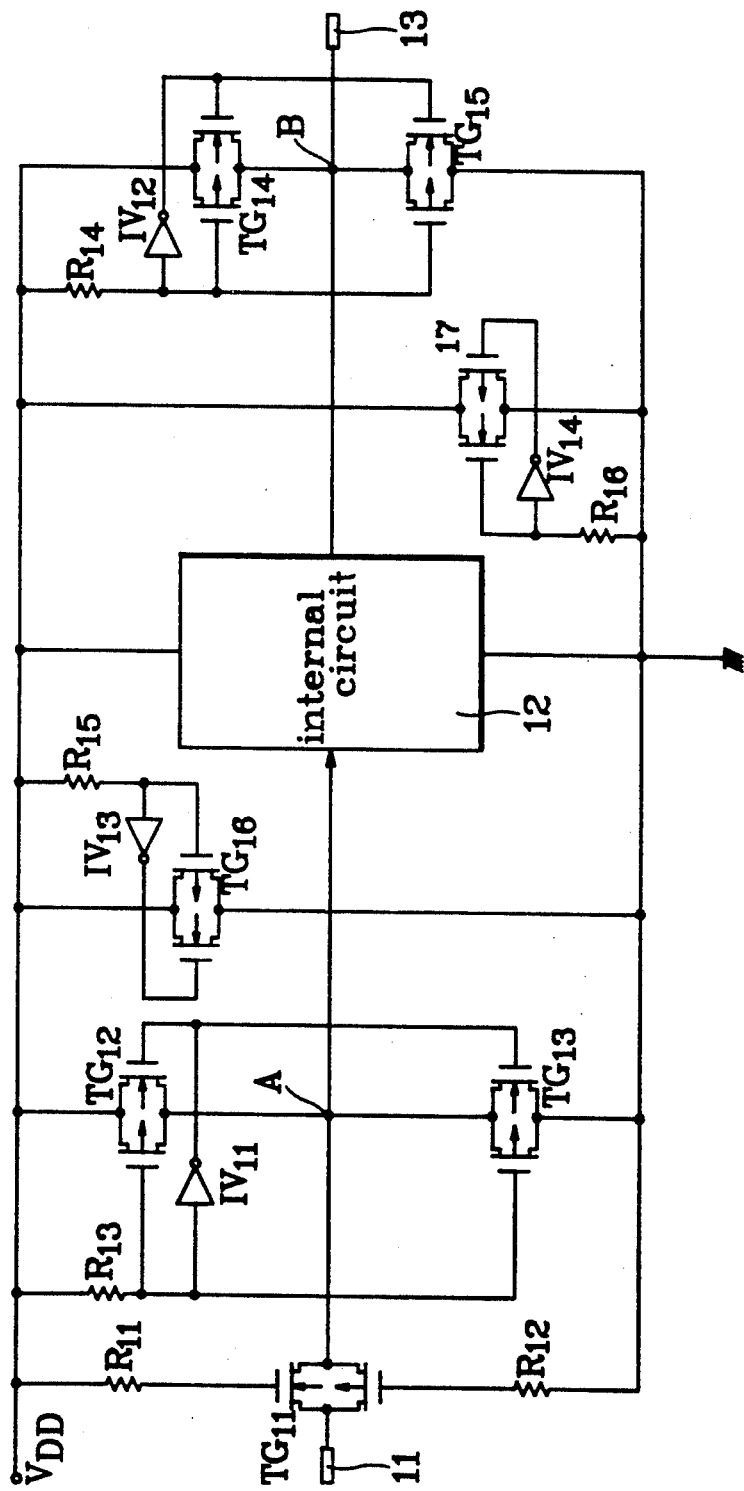
FIG. 4 is a circuit diagram of another embodiment of the protection circuit according to the present invention.
Figure 5:
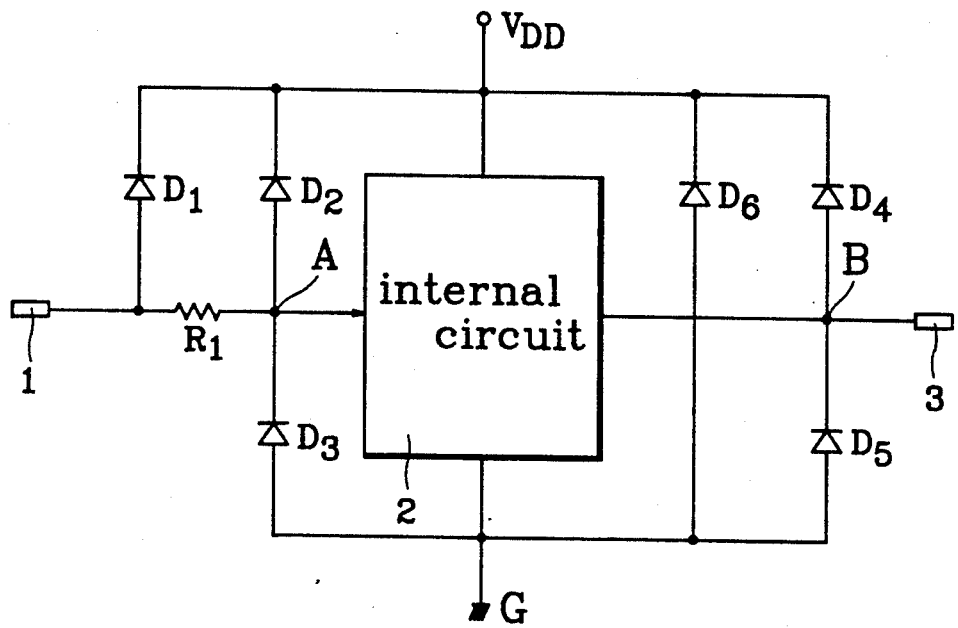
FIG. 5 is a circuit diagram of a protection circuit for background.
Figure 6:
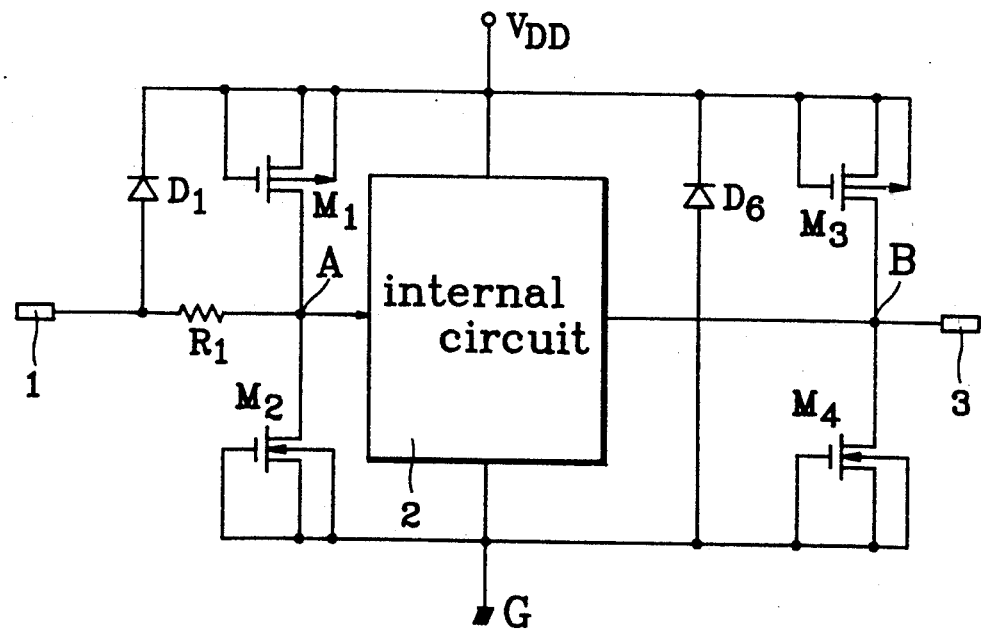
FIG. 6 is a circuit diagram of another protection circuit for background.

Another embodiment of a protection circuit according to the invention is shown in FIG. 4. In this embodiment, transmission gates $TG_{11}$ to $TG_{16}$ are controlled by resistors $R_{11}$ to $R_{15}$ and inverters $IV_{11}$ to $IV_{13}$. Accordingly, the protection circuit is such that power terminal $V_{DD}$ is connected to gates $TG_{11}$ to $TG_{16}$, through resistors $R_{11}$ to $R_{15}$, as shown. Preferably, the resistances of resistors $R_{11}$ to $R_{15}$ are designed to be large. Furthermore, input terminals of the inverters $IV_{11}$ to $IV_{13}$ may be connected to ground terminal G through resistor 16 in such a manner as inverter $IV_{14}$ (although these input terminals are connected to power terminal $V_{DD}$ through resistors $R_{13}$ to $R_{15}$ in the illustrated embodiment), and then output terminals of the inverters can be connected to gates $TG_{11}$ to $TG_{16}$.

These connections can be varied, depending on the characteristics of the processor using the chip. Thus, when the input terminals of the inverts $IV_{11}$ to $IV_{13}$ are connected to power terminal $V_{DD}$ as compare with when they are connected to ground, damage to the internal circuit 12 can be prevented more effectively from a high level of electrostatic charges.

According to the present invention as described above, discharge paths are formed by using transmission gates, and, in this way, the chip is protected from damage, even under a high level of electrostatic charge.

What is claimed is:

1. A semiconductor chip protection circuit comprising:
   a first transmission gate for connection between an input terminal of an internal circuit and an input pin of the semiconductor chip;
   a second transmission gate for connection between the input terminal of the internal circuit and a power terminal;
   a third transmission gate for connection between the input terminal of the internal circuit and a ground terminal;
   a fourth transmission gate for connection between an output terminal of the internal circuit and the power terminal;
   a fifth transmission gate for connection between the output terminal of the internal circuit and the ground terminal; and
   at least one sixth transmission gate for connection between the power terminal and the ground terminal.

2. The circuit of claim 1, further comprising resistors and inverters for controlling the transmission gates.

3. The circuit of claim 2, wherein at least one input terminal of the inverters is connected to the ground terminal.

4. The circuit of claim 2, wherein at least some input terminals of the inverters are connected to the power source.

5. A semiconductor chip including:
   a circuit having an input terminal and an output terminal; and
   means for protecting the circuit from electrostatic charges, the means for protecting comprising an input terminal, an output terminal, a power terminal, a ground, a first transmission gate for connection between the input terminal of the circuit and the input terminal of the means for protecting; a second transmission gate for connection between a connection point of the input terminal of the circuit and the power terminal; a third transmission gate for connection between the connection point and the ground; a fourth transmission gate for connection between the output terminal of the circuit and the power terminal; a fifth transmission gate for connection between the output terminal of the circuit and the ground; and a sixth transmission gate for connection between the power terminal and the ground.

6. The semiconductor chip of claim 5, wherein the means for protecting further comprises resistors and inverters for controlling the transmission gates.

7. The semiconductor chip of claim 6, wherein at least one of the inverters has an input terminal connected to the ground.

8. The semiconductor chip of claim 6, wherein a plurality of the inverters have input terminals connected to the power terminal.

* * * * *

UNITED STATES PATENT AND TRADEMARK OFFICE
CERTIFICATE OF CORRECTION

PATENT NO. : 5,144,519

DATED : September 1, 1992

INVENTOR(S) : Deugsoo Chang

It is certified that error appears in the above-identified patent and that said Letters Patent is hereby corrected as shown below:

```
Column 1, line 13,  change "fetal" to -- fatal --.
Column 1, line 46,  before "pin 1" change "output" to
                    -- input --.

Column 2, line 42,  change "toe" to -- to --.

Column 3, line 68,  before "TG₁₆" insert -- gates --.

Column 4, line 8,   before "N-type" change "a" to -- an --.
Column 4, line 12,  change "transits" to -- transmits --.
Column 4, line 43,  after "tᵣ and" change "tᵢ" to -- t_f --.

Column 5, line 21,  change "inverts" to -- inverters --.
Column 5, line 22,  change "compare" to -- compared --.
```

Signed and Sealed this

Thirtieth Day of November, 1993

Attest:

BRUCE LEHMAN

*Attesting Officer*  *Commissioner of Patents and Trademarks*